United States Patent
Bhuiyan (10) Patent No.: US 8,901,955 B2
(45) Date of Patent: Dec. 2, 2014

(54) HIGH SPEED BUFFER WITH HIGH NOISE IMMUNITY

(71) Applicant: SanDisk Technologies Inc., Plano, TX (US)

(72) Inventor: Ekram H. Bhuiyan, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 101 days.

(21) Appl. No.: 13/669,298

(22) Filed: Nov. 5, 2012

(65) Prior Publication Data
US 2014/0125380 A1 May 8, 2014

(51) Int. Cl.
*H03K 17/16* (2006.01)
*G01R 25/00* (2006.01)

(52) U.S. Cl.
USPC ............ 326/26; 326/29; 326/82; 327/12; 327/34

(58) Field of Classification Search
USPC ............ 327/34, 12, 74, 153, 199, 205, 558; 326/82, 83, 26, 29
See application file for complete search history.

(56) References Cited

U.S. PATENT DOCUMENTS

| | | | |
|---|---|---|---|
| 4,542,525 A | 9/1985 | Hopf | |
| 4,807,198 A | 2/1989 | Flannagan et al. | |
| 5,487,038 A | 1/1996 | Komarek et al. | |
| 6,326,816 B1 | 12/2001 | Su | |
| 6,407,608 B1 | 6/2002 | Brown et al. | |
| 6,456,141 B1 | 9/2002 | Nishizono et al. | |
| 6,965,251 B1 | 11/2005 | Tran et al. | |
| 6,970,032 B1 | 11/2005 | Smith et al. | |
| 7,023,238 B1 | 4/2006 | Camarota | |
| 7,221,199 B2 | 5/2007 | Chung | |
| 7,276,935 B1 | 10/2007 | Camarota | |
| 7,279,948 B2 * | 10/2007 | Kozawa | 327/205 |
| 7,423,456 B2 | 9/2008 | Gomm et al. | |
| 7,928,772 B1 * | 4/2011 | Fong | 327/34 |
| 8,289,755 B1 | 10/2012 | Rahim et al. | |
| 8,466,634 B2 | 6/2013 | Godbole | |
| 2014/0159774 A1 | 6/2014 | Bhuiyan | |

FOREIGN PATENT DOCUMENTS

EP 0 951 145 A1 10/1999
WO WO 2014/070550 5/2014

OTHER PUBLICATIONS

U.S. Notice of Allowance dated May 5, 2014 issued in U.S. Appl. No. 13/712,467.
PCT International Search Report and Written Opinion dated Feb. 21, 2014 issued in PCT/US2013/066348.

* cited by examiner

*Primary Examiner* — Vibol Tan
(74) *Attorney, Agent, or Firm* — Brinks Gilson & Lione

(57) ABSTRACT

This disclosure provides examples of circuits, devices, systems, and methods for providing high speed operation with high noise immunity. In one implementation, a circuit includes a first buffer configured to receive an incoming signal and to generate a first output signal. The circuit also includes a second buffer configured to receive the incoming signal and to generate a second output signal. The second buffer exhibits hysteresis with lower and upper thresholds. The circuit also includes an output block configured to receive the first and second output signals and to generate a third output signal. The output block is configured to switch a logic state of the third output signal in response to a transition of a logic state of the first output signal, and to lock the logic state of the third output signal until the output block receives a transition of a logic state of the second output signal.

18 Claims, 8 Drawing Sheets

HIGH SPEED BUFFER WITH HIGH NOISE IMMUNITY

TECHNICAL FIELD

This disclosure relates generally to input/output (I/O) circuits, and more specifically, to buffers that achieve both high speed operation as well as a high degree of noise immunity.

DESCRIPTION OF THE RELATED TECHNOLOGY

I/O circuits such as input buffers are utilized in a variety of devices and systems. For example, I/O circuits and input buffers can be used in a variety of nonvolatile memory systems and for a variety of applications. Some nonvolatile memory systems are embedded in a larger system such as a personal computer, for example, as a Solid State Drive (SSD). Other removable nonvolatile memory systems are connected to a host system and may be interchanged between different host systems. Examples of nonvolatile memory systems include memory cards, USB flash drives, and removable SSDs. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards.

SUMMARY

This disclosure provides examples of circuits, devices, systems, and methods for providing high speed operation with high noise immunity. In some implementations, a circuit includes a first buffer configured to receive an incoming signal and to generate a first output signal based on the incoming signal. The circuit also includes a second buffer configured to receive the incoming signal and to generate a second output signal based on the incoming signal. The second buffer exhibits hysteresis with a lower threshold and an upper threshold. The circuit also includes an output block configured to receive the first output signal and the second output signal and to generate a third output signal based on the first and second output signals. The output block is configured to switch a logic state of the third output signal in response to a transition of a logic state of the first output signal, and to lock the logic state of the third output signal until the output block receives a transition of a logic state of the second output signal.

In some implementations, the first buffer also exhibits hysteresis with a lower threshold and an upper threshold. In such implementations, the upper threshold of the second buffer can be more positive than the upper threshold of the first buffer, while the lower threshold of the second buffer can be more negative than the lower threshold of the first buffer. In some such implementations, in an initial state, the incoming signal is low, the first output signal is in a first logic state, the second output signal is in a second logic state, and the third output signal is in a third logic state. From this state, when the incoming signal rises above the upper threshold of the first buffer, the first buffer transitions the first output signal to a fourth logic state, the output block transitions the third output signal to a sixth logic state based on the fourth logic state, and the output block locks the third output signal in the sixth logic state based on the fourth logic state. In some such implementations, when the incoming signal rises above the upper threshold of the second buffer, the second buffer transitions the second output signal to a fifth logic state, and the output block unlocks the third output signal based on the fifth logic state. In some such implementations, when the incoming signal falls below the lower threshold of the first buffer, the first buffer transitions the first output signal to the first logic state, the output block transitions the third output signal to the third logic state based on the first logic state, and the output block locks the third output signal in the third logic state based on the first logic state. In some such implementations, when the incoming signal falls below the lower threshold of the second buffer, the second buffer transitions the second output signal to the second logic state, and the output block unlocks the third output signal based on the second logic state.

In some other implementations, the first buffer has substantially zero hysteresis and the first buffer has a first threshold. In some such implementations, in an initial state, the incoming signal is low, the first output signal is in a first logic state, the second output signal is in a second logic state, and the third output signal is in a third logic state. In some such implementations, when the incoming signal rises above the first threshold, the first buffer transitions the first output signal to a fourth logic state, the output block transitions the third output signal to a sixth logic state based on the fourth logic state, and the output block locks the third output signal in the sixth logic state based on the fourth logic state. In some such implementations, when the incoming signal rises above the upper threshold of the second buffer, the second buffer transitions the second output signal to a fifth logic state, and the output block unlocks the third output signal based on the fifth logic state. In some such implementations, when the incoming signal falls below the first threshold, the first buffer transitions the first output signal to the first logic state, the output block transitions the third output signal to the third logic state based on the first logic state, and the output block locks the third output signal in the third logic state based on the first logic state. In some such implementations, when the incoming signal falls below the lower threshold of the second buffer, the second buffer transitions the second output signal to the second logic state, and the output block unlocks the third output signal based on the second logic state.

In some implementations, one or both of the first buffer and the second buffer is or includes a Schmitt trigger circuit. In some implementations, the output block is configured to lock and unlock the third output signal by latching and unlatching, respectively, the third output signal in response to transitions of the second buffer. In some implementations, the circuit is part of a memory device. In some implementations, the incoming signal is a data signal. In some implementations, the incoming signal is a clock signal.

BRIEF DESCRIPTION OF THE DRAWINGS

Like reference numbers and designations in the various drawings indicate like elements.

DETAILED DESCRIPTION

This disclosure provides examples of circuits, devices, systems, and methods for providing high speed operation with high noise immunity. Particular implementations described herein relate to a circuit that includes two buffers having different hysteresis. In some implementations, a first one of the buffers has a narrow hysteresis or no hysteresis while a second one of the buffers has a wide hysteresis. The circuit further includes an output block that receives output signals from the first and second buffers and generates an output signal based on the output signals from the first and second buffers. As will be described below, the buffers and the output block can be arranged or configured to provide for a high degree of immunity from noise in the incoming signal while maintaining high speed operation of the circuit overall.

The circuits described herein can be utilized in a variety of applications. In some implementations, the circuits described herein are used in digital electronic devices or systems. For example, in some implementations, the circuits described herein can be used in a memory device. For example, the circuits can be used in solid state memory devices such as memory cards, USB flash drives, and removable SSDs. In some implementations, the circuits can be input/output I/O circuits (or interfaces) for a controller, such as a memory controller. In some implementations, the memory controller can be used in a host interface for a memory card such as, for example, a PC Card, a CF™ card, a SmartMedia™ card, a MMC™ card, an SD card, a miniSD™ card, a SIM card, a Memory Stick™ card, a Memory Stick Duo card, a microSD/TransFlash™ card, a Compact Flash card, or an iNAND card. In some other implementations, the circuits can be used in other devices or systems. Generally, various implementations described herein can be used in any circuit in which speed and noise immunity are desired, including non-memory circuits.

Figure 1:
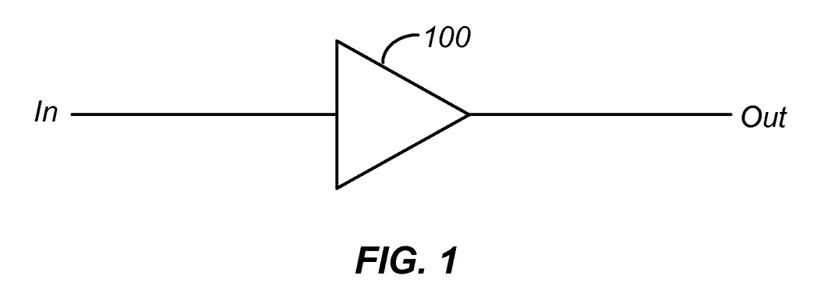
FIG. 1 shows a buffer.
Figure 2A:
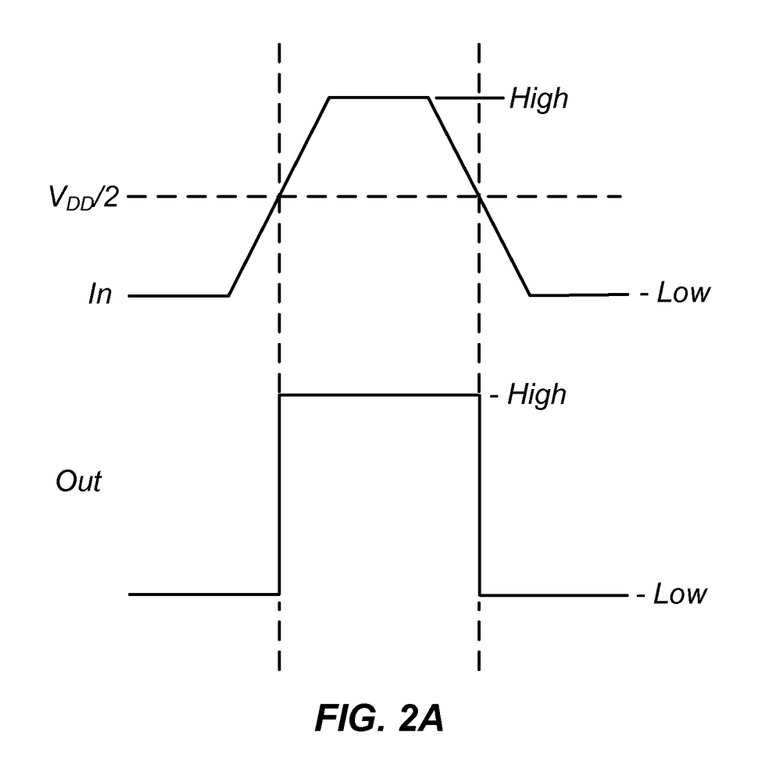
FIG. 2A shows a timing diagram depicting an example incoming signal In and the corresponding output signal Out generated as a result of passing the incoming signal In through the buffer of FIG. 1.

FIG. 1 shows a traditional buffer 100. The buffer 100 is a circuit (e.g., an input buffer) configured to receive an incoming signal In and to generate an output signal Out based on the incoming signal In. FIG. 2A shows a timing diagram depicting an example incoming signal In and the corresponding output signal Out generated as a result of passing the incoming signal In through the buffer 100 of FIG. 1. As shown, the output signal Out transitions from low (e.g., logic "0" or "zero", or ground in some implementations) to high (e.g., logic "1" or "one," or $V_{DD}$ in some implementations) when the incoming signal In rises above a threshold (e.g., generally $V_{DD}/2$) while the output signal Out transitions from high to low when the incoming signal In falls below the threshold (e.g., $V_{DD}/2$).

Figure 2B:
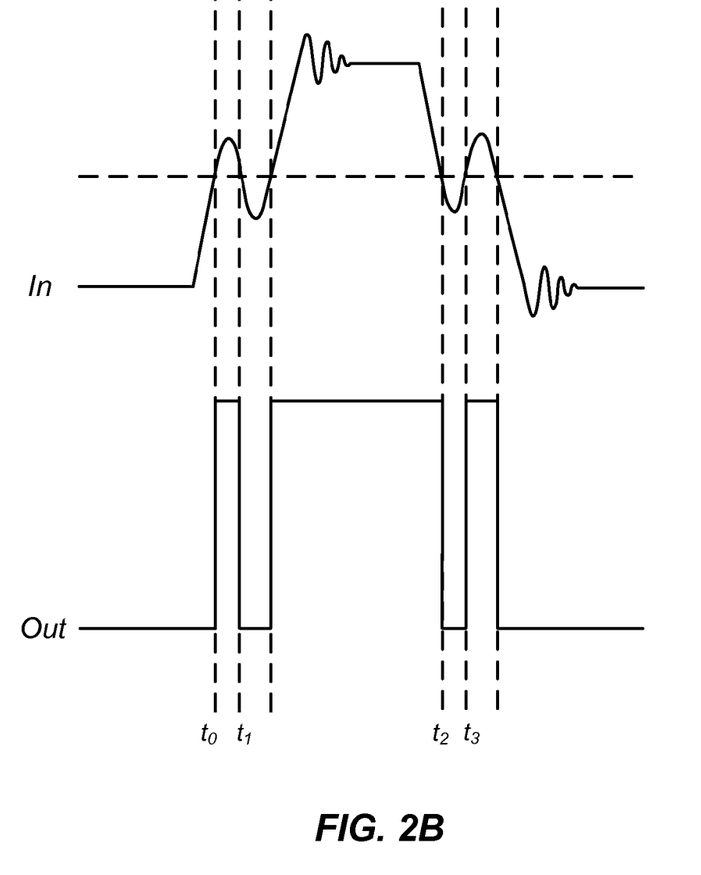
FIG. 2B shows a timing diagram depicting an example noisy incoming signal In and the corresponding output signal Out generated as a result of passing the incoming signal In through the buffer of FIG. 1.

FIG. 2B shows a timing diagram depicting an example noisy incoming signal In and the corresponding output signal Out generated as a result of passing the noisy incoming signal In through the buffer 100 of FIG. 1. FIG. 2B highlights the detrimental effects that can result from noise. For example, the noise in or on the incoming signal In can result in erroneous or unintended transitions in the output signal Out. For example, although the output signal Out transitions correctly at time $t_0$ from low to high, the output signal Out erroneously transitions from high to low at time $t_1$ as a result of noise. Similarly, although the output signal Out transitions correctly at time $t_2$ from high to low, the output signal Out erroneously transitions from low to high at $t_3$. Such resulting noise or errors in the output signal Out can then be propagated through other circuits or an entire system. As another example where the incoming signal represents data, a sampler may sample the data during a time when the output signal value is erroneously high or erroneously low. As another example where the incoming signal represents a clock signal, a receiver of the output clock signal may perform a function, such as sampling, at an unintended time, which may then result in erroneous data being read.

In some applications or implementations, the output signal Out can be configured to transition to the opposite polarity or in the opposite direction of the incoming signal In. That is, any of the circuits described herein can be configured to invert the incoming signal In; for example, to transition the output signal Out to low when the incoming signal In transitions to high and, conversely, to transition the output signal Out to high when the incoming signal In transitions to low.

Figure 3:
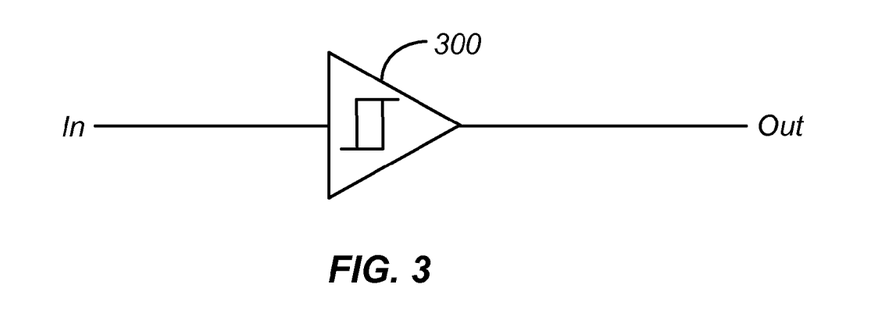
FIG. 3 shows a buffer with hysteresis.
Figure 4A:
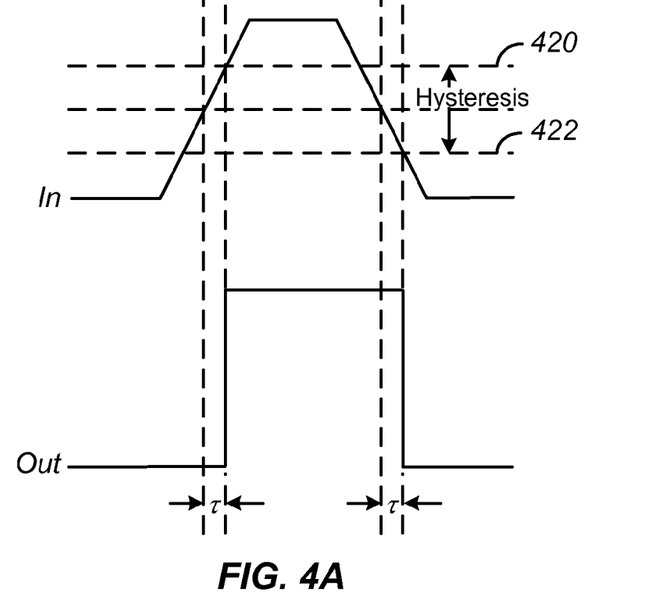
FIG. 4A shows a timing diagram depicting an example incoming signal In and the corresponding output signal Out generated as a result of passing the incoming signal In through the buffer of FIG. 3.
Figure 4B:
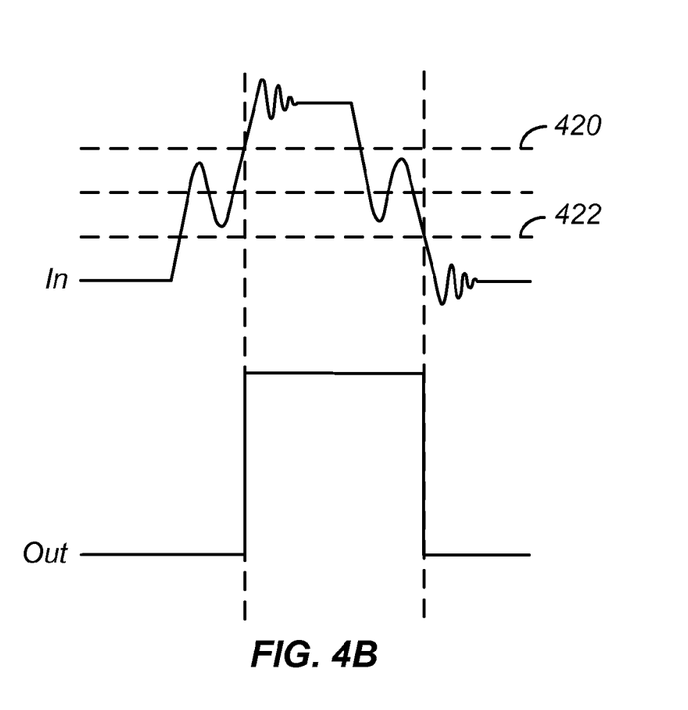
FIG. 4B shows a timing diagram depicting an example noisy incoming signal In and the corresponding output signal Out generated as a result of passing the incoming signal In through the buffer of FIG. 3.

A circuit that is characterized by or manifests hysteresis can be used to provide for some degree of noise immunity. FIG. 3 shows a buffer 300 with hysteresis. The buffer 300 is configured to receive an incoming signal In and to generate an output signal Out based on the incoming signal In. FIG. 4A shows a timing diagram depicting an example incoming signal In and the corresponding output signal Out generated as a result of passing the incoming signal In through the buffer 300 of FIG. 3. As shown, the output signal Out transitions from low to high when the incoming signal In rises above an upper threshold 420 of the hysteresis range (rather than at, e.g., $V_{DD}/2$) while the output signal Out transitions from high to low when the incoming signal In falls below a lower threshold 422 of the hysteresis range (rather than at, e.g., $V_{DD}/2$). As shown, the hysteresis introduces a delay τ between when the output signal Out would have transitioned without hysteresis (e.g., at $V_{DD}/2$) and when the output signal Out does transition because of the hysteresis (e.g, at the upper threshold 420). FIG. 4B shows a timing diagram depicting an example noisy incoming signal In and the corresponding output signal Out generated as a result of passing the noisy incoming signal In through the buffer 300 of FIG. 3. FIG. 4B highlights the noise immunity that can be achieved using hysteresis.

Figure 5A:
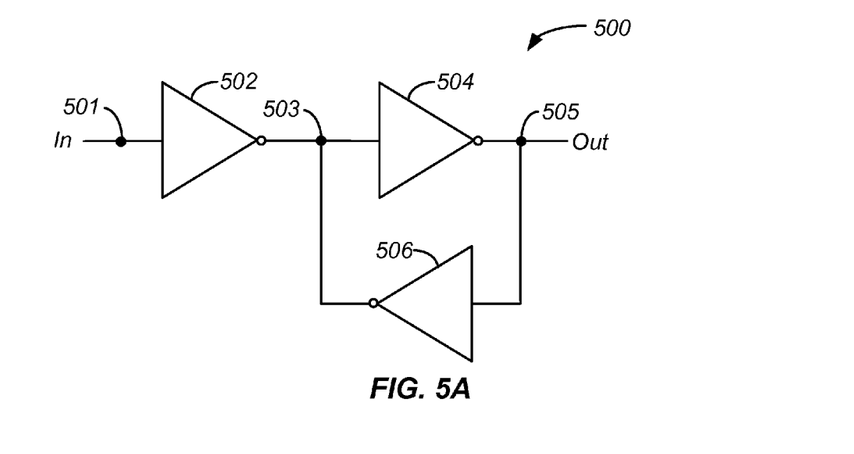
FIG. 5A shows one simple example of a buffer that exhibits hysteresis and is implemented with three inverters.
Figure 5B:
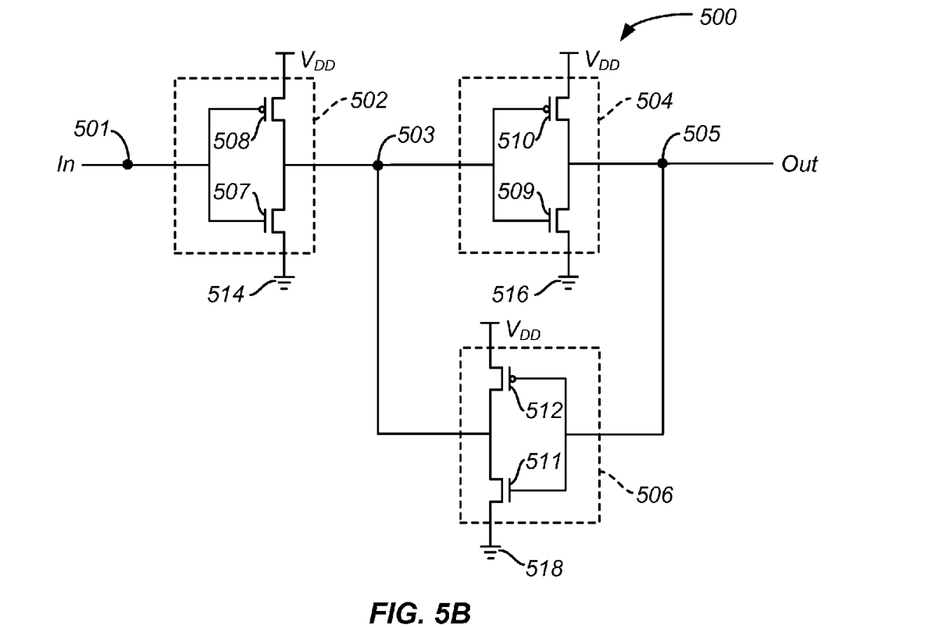
FIG. 5B shows an example of the buffer of FIG. 5A in which the strong inverters and the weak inverter are implemented with MOS transistors.

FIG. 5A shows one simple example of a buffer 500 that exhibits hysteresis and is implemented with three inverters. Because of the configuration of the inverters, the buffer 500 outputs an output signal Out that is of the same polarity as the incoming signal In (e.g., when In is low, Out is low, and when In is high, Out is high). The buffer 500 includes a first "strong" inverter 502, a second strong inverter 504, and a third "weak" inverter 506. FIG. 5B shows an example of the buffer 500 of FIG. 5A in which the strong inverters 502 and 504 and the weak inverter 506 are implemented with MOS transistors. For example, assume an initial state in which the incoming signal In on the input node 501 is low. In this state, the NMOS transistor 507 of the first strong inverter 502 is off (non-conducting) while the PMOS transistor 508 of the strong inverter 502 is on (conducting). As a result, the PMOS transistor 508 maintains the output node 503 at $V_{DD}$; that is, the output signal Out is high. The output node 503 of the first strong inverter 502 is connected with the input node of the second strong inverter 504. Because the output node 503 is high, the NMOS transistor 509 of the second strong inverter 504 is on while the PMOS transistor 510 of the second strong inverter 504 is off. As a result, the NMOS transistor 509 maintains the output node 505 of the buffer 500 at ground because the ground 516 pulls down the output node 505; that is, the output signal Out is low. The output node 505 is also connected with the input node of the weak inverter 506. Because the output signal Out is low, the NMOS transistor 511 of the weak inverter 506 is off while the PMOS transistor 512 of the weak inverter 504 is on. As a result, the PMOS transistor 512 also maintains the node 503 at high.

Now, as the incoming signal In on the input node 501 transitions from low to high, the PMOS transistor 508 of the first strong inverter 502 turns off, while the NMOS transistor 507 of the first strong inverter 502 turns on resulting in a path from the node 503 to ground 514. This has the effect of pulling the node 503 down to low. As the node 503 is pulled low, the NMOS transistor 509 of the second strong inverter 504 turns off, while the PMOS transistor 510 of the second strong inverter 504 turns on resulting in a path from $V_{DD}$ to the output node 505 of the buffer 500. This has the effect of pulling the output node 505 up to high. As the output node 505 is pulled high, the PMOS transistor 512 of the weak inverter 506 turns off, while the NMOS transistor 511 of the weak inverter 506 turns on resulting in a path from the node 503 to ground 518.

The strong inverters 502 and 504 are named as such because the PMOS and NMOS transistors of the strong inverters are, for example, larger or much larger (e.g., have much larger or wider gates) than the PMOS and NMOS transistors of the weak inverter 506. For example, in some implementations, the PMOS and NMOS transistors of the strong inverters 502 and 504 are approximately 2, 5, 10, or more times larger than the PMOS and NMOS transistors of the weak inverter 506, respectively. Because the strong inverters 502 and 504 can act faster owing to the greater current carrying capabilities of the strong inverters relative to the weak inverter 506, the PMOS and NMOS transistors of the strong inverters 502 and 504 can switch off and on faster than the PMOS and NMOS transistors of the weak inverter 506 can switch off and on. The result is that, for example, during an initial transition period as the incoming signal In is rising, the first strong inverter 502 switches faster than the weak inverter 506. Thus, although the first strong inverter 502 is pulling the node 503 down, the weak inverter 506 continues to pull the node 503 up reducing the effect of the strong inverter 502 and delaying the transition of the output signal Out on the output node 505. This builds hysteresis into the circuit, and in particular, adds an upper threshold of the hysteresis of the buffer 500. In this way, when the incoming signal In is rising, only when the upper threshold voltage is reached does the output signal Out transition to high. The second strong inverter 504 also can affect the hysteresis of the buffer 500 because it too switches faster than the weak inverter 506.

Conversely, once the buffer 500 is in a state in which the incoming signal In on the input node 501 is high, the NMOS transistor 507 of the first strong inverter 502 is on while the PMOS transistor 508 of the strong inverter 502 is off. As a result, the NMOS transistor 507 of the strong inverter 502 maintains the node 503 at low. Because the signal on the node 503 is low, the NMOS transistor 509 of the second strong inverter 504 is off, while the PMOS transistor 510 of the second strong inverter 504 is on pulling the output signal Out on the output node 505 up to high. Because the output node 505 is high, the PMOS transistor 512 of the weak inverter 506 is off, while the NMOS transistor 511 of the weak inverter 504 is on. Now, as the incoming signal In on the input node 501 transitions from high to low, the NMOS transistor 507 of the first strong inverter 502 turns off, while the PMOS transistor 508 of the first strong inverter 502 turns on resulting in a path from $V_{DD}$ to the node 503. This has the effect of pulling the node 503 up to high. As the node 503 is pulled high, the PMOS transistor 510 of the second strong inverter 504 turns off, while the NMOS transistor 509 of the second strong inverter 504 turns on resulting in a path from the output node 505 of the buffer 500 to the ground 516. This has the effect of pulling the output node 505 down to low. As the output node 505 is pulled low, the NMOS transistor 511 of the weak inverter 506 turns off, while the PMOS transistor 512 of the weak inverter 506 turns on resulting in a path from $V_{DD}$ to the node 503.

Again, because the strong inverters 502 and 504 can act faster owing to the greater current carrying capabilities of the strong inverters relative to the weak inverter 506, the PMOS and NMOS transistors of the strong inverters 502 and 504 can switch off and on faster than the PMOS and NMOS transistors of the weak inverter 506 can switch off and on. The result is that during an initial transition period as the incoming signal In is falling, the first strong inverter 502 switches faster than the weak inverter 506. Thus, although the first strong inverter 502 is pulling the node 503 up, the weak inverter 506 continues to pull the node 503 down reducing the effect of the strong inverter 502 and delaying the transition of the output signal Out on the output node 505. This again builds hysteresis into the circuit, and in particular, adds a lower threshold of the hysteresis of the buffer 500. In this way, when the incoming signal In is falling, only when the lower threshold voltage is reached does the output signal Out transition to low.

Again, the second strong inverter 504 also can affect the hysteresis of the buffer 500 because it too switches faster than the weak inverter 506.

In this sense, the hysteresis of the circuit can be considered the range of voltage values between the upper and lower thresholds (e.g., thresholds 420 and 422) for which the output signal Out will not transition from its current state or value. As can be seen from this example, the wider the hysteresis, the more noise immunity can be achieved; that is, the more noise the buffer 500 can tolerate without erroneously transitioning. However, the delay $\tau$ that is introduced by the hysteresis increases as the width of the hysteresis increases. Although noise immunity is desired, the delay $\tau$ can prohibit the use of wide hysteresis in circuits used in high speed communications. Thus, there is generally a tradeoff between speed and noise immunity.

Additionally, although the buffer 500 provides a simple example for didactic purposes of describing how hysteresis can be achieved using a circuit that includes simple inverters each implemented with a pair of NMOS and PMOS transistors, there are a wide variety of other circuits with hysteresis that can be used in implementations of the invention. For example, a Schmitt trigger is one such example. Other examples include other buffers or circuits including bistable circuits (e.g., latches) and circuits with feedback (e.g., positive feedback). Additionally, any of the circuits described herein can be readily adapted to work with both single-ended as well as differential (complementary) signals.

Figure 6A:
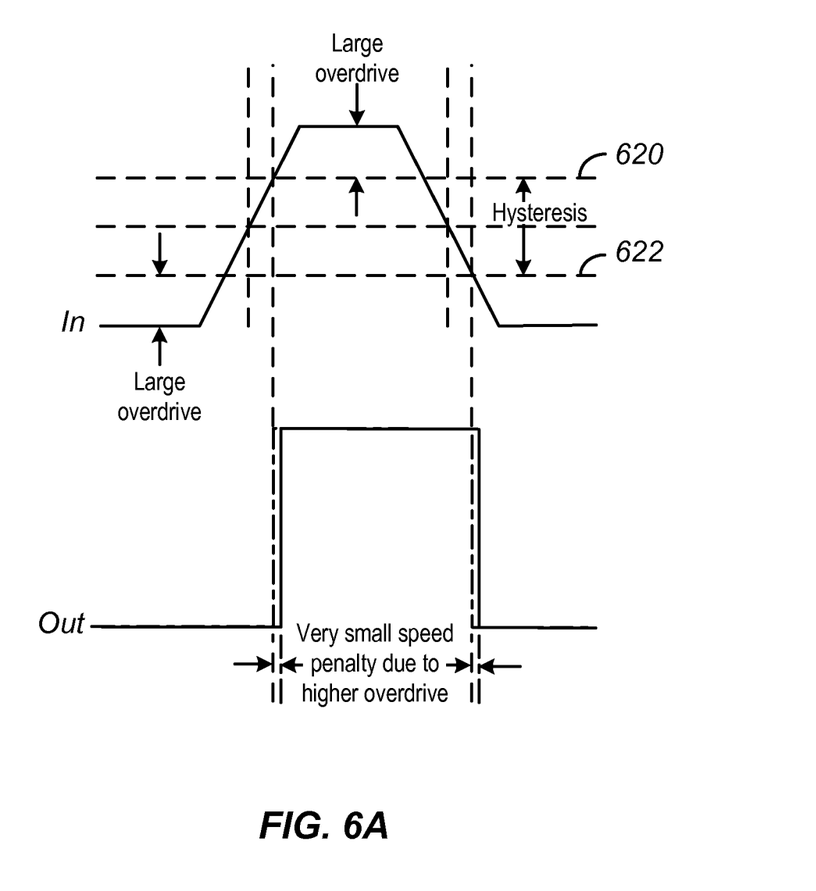
FIG. 6A shows a timing diagram depicting an example incoming signal In and the corresponding output signal Out generated as a result of passing the incoming signal In through the buffer of FIG. 3 when there is large overdrive.

Additionally, other factors such as the voltage overdrive can be critical in determining whether a buffer (e.g., buffer 300 of FIG. 3) will meet the speed requirements of the overall circuit or system. For example, FIG. 6A shows a timing diagram depicting an example incoming signal In and the corresponding output signal Out generated as a result of passing the incoming signal In through a buffer when there is large overdrive; that is, when the highs and lows of the incoming signal In are substantially rail-to-rail (e.g., 0 V to $V_{DD}$, or $-V_{DD}/2$ to $V_{DD}/2$, or some other range). The overdrive can be considered the voltage difference between the voltage value of the high logic state and the upper threshold 620 when the incoming signal In is rising or the voltage difference between the voltage value of the low logic state and the lower threshold 622 when the incoming signal In is falling. As shown in FIG. 6A, there is only a small speed penalty associated with the output transition. That is, there is an inherent delay in the buffer (e.g., in switching NMOS and PMOS transistors or otherwise activating and transitioning circuit elements such as inverters). This delay can be reduced with larger overdrive such that the transitions between logic states occur faster.

Figure 6B:
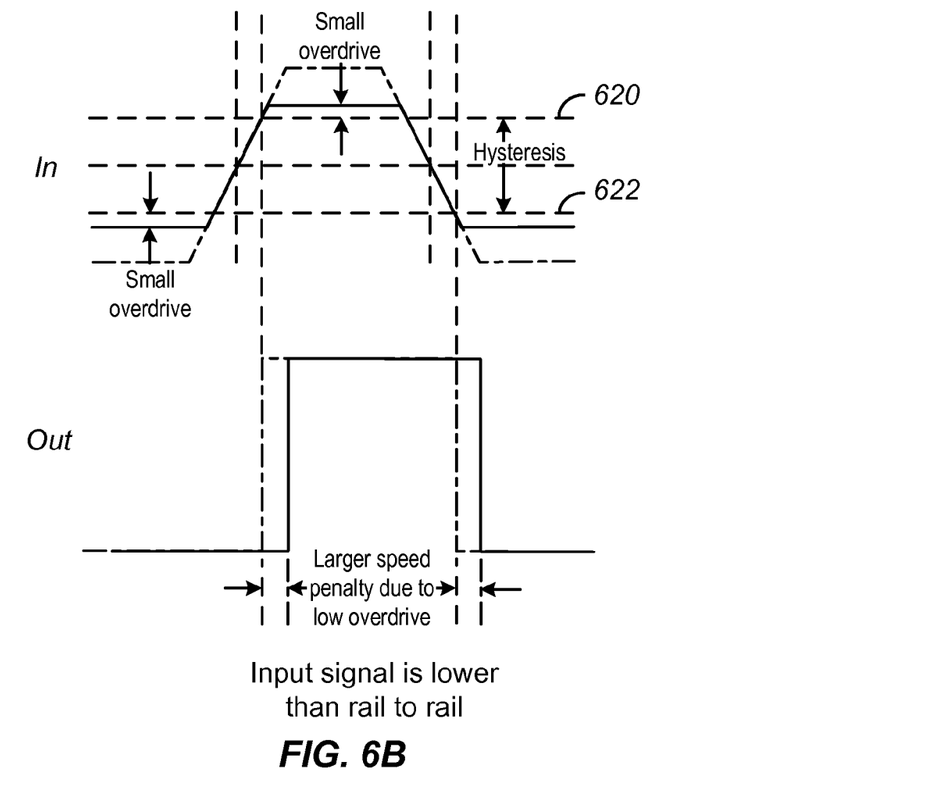
FIG. 6B shows a timing diagram depicting an example incoming signal In and the corresponding output signal Out generated as a result of passing the incoming signal In through the buffer of FIG. 3 when there is small overdrive.

FIG. 6B shows a timing diagram depicting an example incoming signal In and the corresponding output signal Out generated as a result of passing the incoming signal In through a buffer when there is small overdrive. For example, when the incoming signal In is less or much less than rail-to-rail resulting in small overdrive. As shown in FIG. 6B, there can be a significant speed penalty associated with the inherent delay of the inverters because the inherent delay is magnified or exacerbated by the lack of overdrive.

Figure 7:
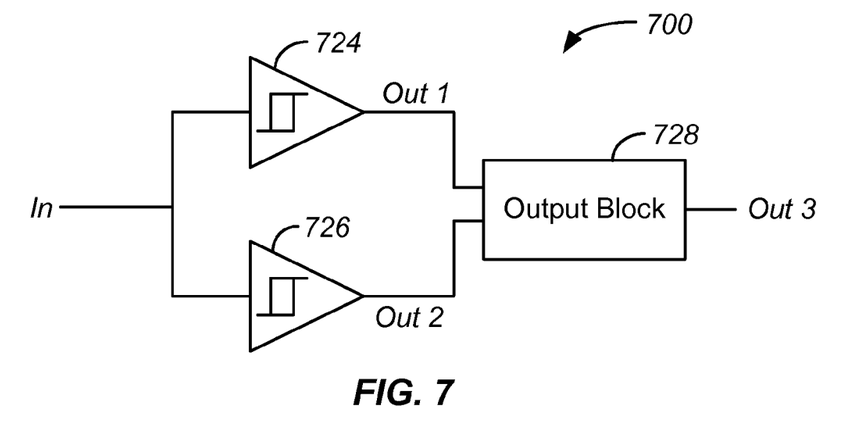
FIG. 7 shows a buffering circuit according to one example implementation of the present invention.

FIG. 7 shows a buffering circuit 700 (hereinafter "circuit 700" or "buffer 700") according to one example implementation of the present invention. The circuit 700 includes a first buffer 724, a second buffer 726, and an output block 728. For example, in some implementations, one or both of the first buffer 724 and the second buffer 726 can be the same as or similar to the buffers 300 or 500 described above. In some implementations, one or both of the first buffer 724 and the second buffer 726 can have one or more variations or modifications relative to the buffers 300 and 500 described above. In some implementations, one or both of the first buffer 724 and the second buffer 726 can be implemented as an inverting or non-inverting Schmitt trigger buffer or a variation thereof.

In some implementations, the first buffer 724 can be any high speed buffer with little or no hysteresis. In some implementations, the hysteresis of the first buffer 724 is narrow (little), substantially zero, or zero. For example, the hysteresis of the first buffer can be selected or tuned to achieve timing, speed, or other requirements that may vary from application to application. Thus, in some implementations, the first buffer 724 can be considered relatively fast enabling the first buffer to meet the speed requirements of high speed systems, but may have little or substantially no noise immunity.

In contrast, the second buffer 726 has a relatively wide hysteresis. In some implementations, the second buffer 726 can be any buffer with relatively wide hysteresis. For example, in some example implementations, the second buffer 726 has a hysteresis that varies according to application and especially according to the level of noise immunity desired in meeting the requirements of the particular application. Thus, in some implementations, the second buffer 726 can be considered as providing a high degree of noise immunity while being relatively slower as compared with the first buffer 724.

In the implementation depicted in FIG. 7, both the first buffer 724 and the second buffer 726 are configured to receive an incoming signal In. The first buffer 724 is further configured to generate an output signal Out1 while the second buffer 726 is further configured to generate an output signal Out2. The output block 728 is configured to receive the output signals Out1 and Out2 and to generate an output signal Out3. In some implementations, the output block 728 can be a combiner (or combining circuit) or a selector (or selecting circuit). For example, in some implementations, the output block 728 can be characterized as combining information from output signals Out1 and Out2 to generate the output signal Out3. In some implementations, the output block 728 can be characterized as selecting information from output signal Out1 based on information from Out2 to generate the output signal Out3. In some implementations, the output block 728 can include combinational logic. In some alternative implementations, the output block 728 can include sequential or other types of logic.

Figure 8A:
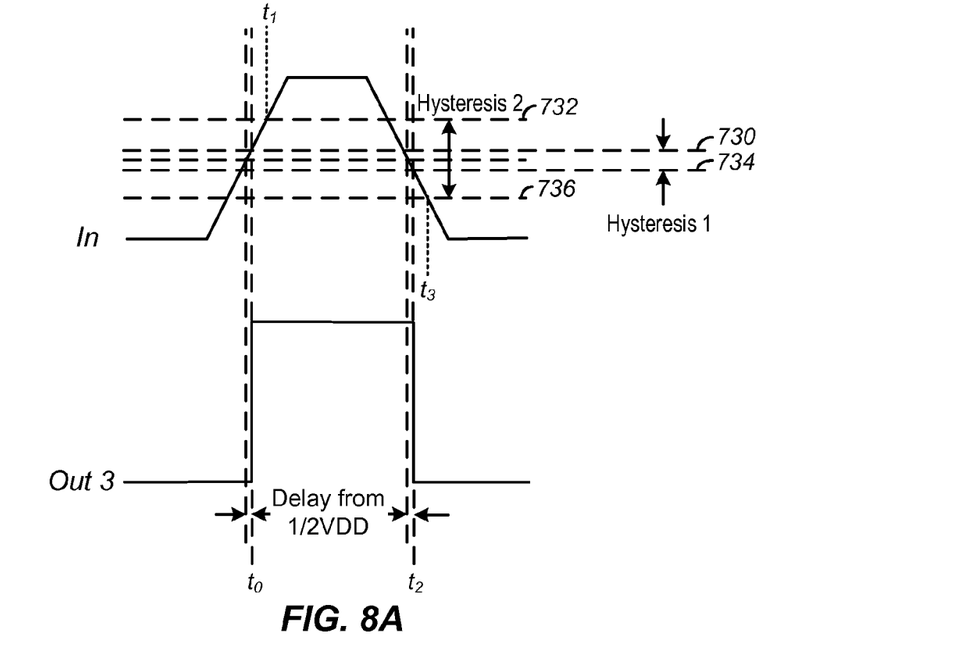
FIG. 8A shows a timing diagram depicting an example incoming signal In and the corresponding output signal Out3 generated as a result of passing the incoming signal In through the circuit of FIG. 7.

FIG. 8A shows a timing diagram depicting an example of an incoming signal In and the corresponding output signal Out3 generated as a result of passing the incoming signal In through the circuit 700 of FIG. 7. As shown, in this implementation, the output signal Out3 transitions from low to high when a rising incoming signal In rises above an upper threshold 730 of the first buffer 724 at $t_0$. More specifically, when the rising incoming signal In rises above the upper threshold 730 of the first buffer 724 at time $t_0$, the output signal Out1 of the first buffer 724 transitions to high. The output block 728, in response to receiving the high output signal Out1, generates a high output signal Out3. Output block 728 is configured such that Out3 is locked into the high state when In first rises above the upper threshold 730 of the hysteresis of the first buffer 724. That is, no matter what the variation in the value of Out1, after $t_0$ the output block 728 locks Out3 to high. For example, the output signal Out3 can be latched at high. In such implementations, when In rises above the upper threshold 732 of the second buffer 726 at $t_1$, the output signal Out2 transitions to high and the output block 728 releases the lock on the output signal Out3.

When the incoming signal In falls below the lower threshold 734 of the first buffer 724 at time $t_2$, the output signal Out1 of the first buffer 724 transitions to low. The output block 728 then locks the output signal Out3 to low. For example, the output signal Out3 can be latched at low. In such implementations, when In falls below the lower threshold 736 of the second buffer 726 at $t_3$, the output signal Out2 transitions to low and the output block 728 releases the lock on the output signal Out3. Now, in order for Out3 to transition again, the incoming signal In must again cross the upper threshold 730 of the first buffer 724. In this manner, the circuit 700 achieves the speed of the narrow hysteresis buffer 724 while getting the benefit of the high degree of noise immunity of the wide hysteresis buffer 726. It will be appreciated that, in some implementations, the first buffer 724 can have no hysteresis such that the upper and lower thresholds 730 and 732 are the same or substantially the same resulting in zero or substantially zero delay.

It should also be appreciated that the circuit 700 also can be configured such that the output signal Out3 transitions from high to low when a rising incoming signal In rises above an upper threshold 730 of the hysteresis of the first buffer 724 at $t_0$. In such implementations, the circuit 700 also can be configured such that the output signal Out3 transitions from low to high when a falling incoming signal In falls below a lower threshold 734 of the hysteresis of the first buffer 724 at $t_2$. For example, in such implementations, the first buffer 724 can be configured to invert the incoming signal In. In these or other implementations, the output block 728 also can be configured to invert the output signal Out1 such that Out3 is of opposite polarity than Out1 and the same as or opposite to the polarity of In (depending on whether the first buffer 724 inverts the incoming signal In).

Figure 8B:
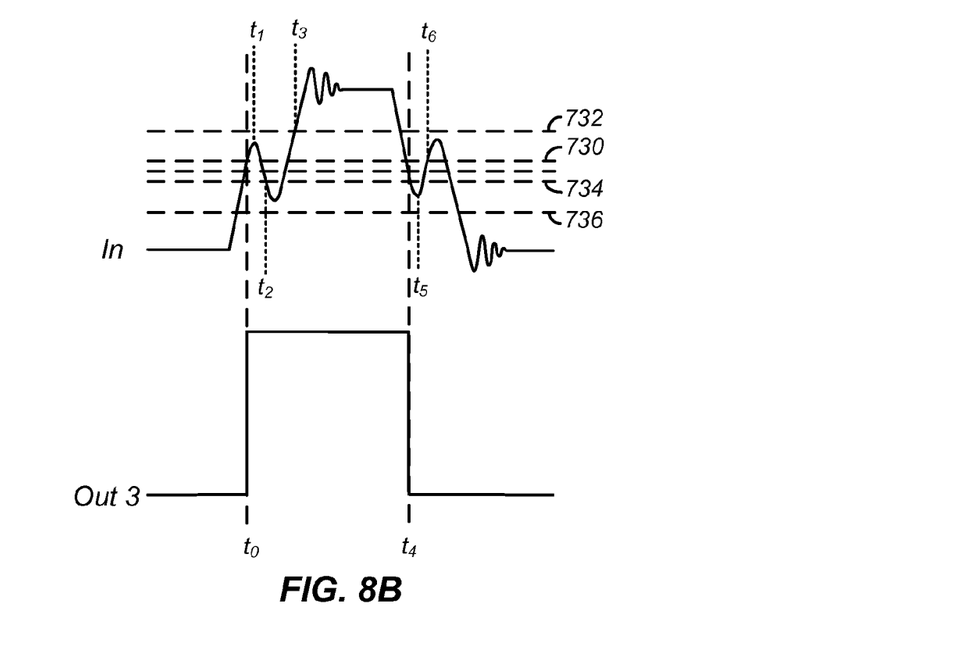
FIG. 8B shows a timing diagram depicting an example noisy incoming signal In and the corresponding output signal Out3 generated as a result of passing the incoming signal In through the circuit of FIG. 7.

FIG. 8B shows a timing diagram depicting an example noisy incoming signal In and the corresponding output signal Out3 generated as a result of passing the incoming signal In through the circuit 700 of FIG. 7. FIG. 8B illustrates the noise immunity that can be achieved using the arrangement of circuit 700. Again, because of the narrow (or zero) hysteresis of the first buffer 724, the time delay associated with hysteresis is small or minimal and, additionally, the inherent delay in the buffer 724 is reduced because of the resulting large overdrive. As shown in FIG. 8B, because the output block 728 locks the output signal Out3 to high after the incoming signal In crosses the upper threshold 730 of the hysteresis of the first buffer 724 at $t_0$, even when the incoming signal In falls at $t_1$ and goes below the lower threshold 734 of the first buffer at $t_2$, the output signal Out3 remains locked at high. It is not until $t_3$ that the output block 728 unlocks the output signal Out3 so that, at $t_4$, when the incoming signal In falls below the lower threshold 734, the output signal Out3 transitions to low. As shown, because the output block 728 locks the output signal Out3 to low after the incoming signal In crosses the lower threshold 734 of the hysteresis of the first buffer 724 at $t_4$, even when the incoming signal In rises at $t_5$ and goes above the upper threshold 730 of the first buffer at $t_6$, the output signal Out3 remains locked at low.

Figure 9:
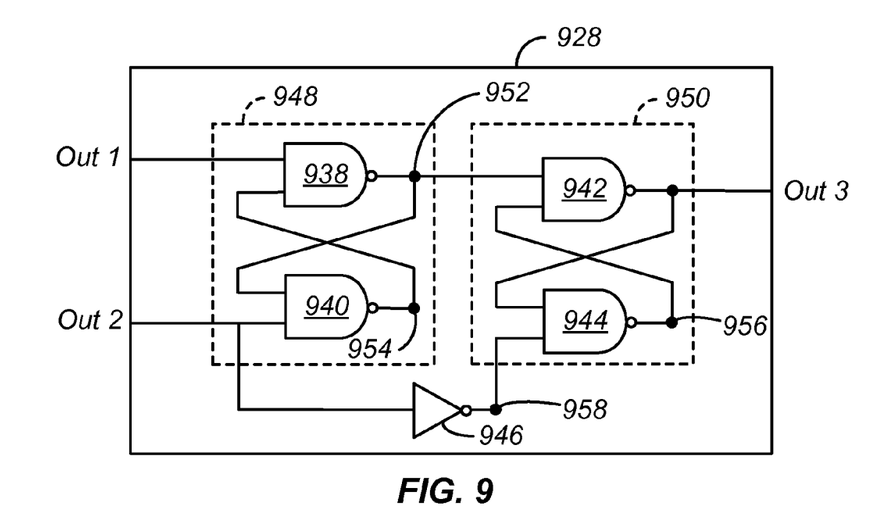
FIG. 9 shows an example circuit that can be used to implement the output block of FIG. 7.

Although implementations of the output block 728 may vary, for example, with respect to whether NAND gates or NOR gates are used in implementations that use such logic gates, FIG. 9 shows an example of a circuit 928 that can be used to implement the output block 728 of FIG. 7. As shown, in this example implementation, the circuit 928 is based on NAND technology and includes four NAND gates 938, 940, 942, and 944, as well as an inverter 946. More specifically, the circuit 928 includes two stages 948 and 950 that each include two cross-coupled NAND gates. Each of the two stages 948 and 950 functions as a latch. The two latches 948 and 950 are connected in series. In some implementations in which the first buffer 724 and the second buffer 726 do not invert the input signal In, in an initial state in which the input signal In is low, the output signals Out1, Out2, and Out3 are low (and the latches 948 and 950 are in a reset state). Because Out2 is low, the nodes 954 and 958 are high. Because the node 954 is high, the output signal Out1 can pass through gate 938 (although inverted), and subsequently through gate 942 (where it is inverted again).

When Out1 transitions to high, the node 952 transitions to low and the output signal Out3 transitions to high. Because Out3 is now high and because the node 958 is high, the node 956 transitions to low and the latch 950 latches (or "locks") the output signal Out3 in the high state. While in this latched state, even if Out1 transitions to low, the output signal Out3 will not transition. From this latched state, when Out2 transitions to high, the node 958 will transition to low and the node 956 will transition to high. As a result, the signal on the node 952 can pass through gate 942 because the latch condition is released. Thus, the output signal Out3 is no longer locked to high. From this state, when Out1 transitions from high to low, the node 952 transitions to high and the output signal Out3 transitions from high to low. In this state, because both Out2 and the signal on the node 952 are high, the node 954 transitions to low. As a result, the latch 948 latches (or "locks") the node 952 in the high state. Thus, the output signal Out3 becomes locked by latch 948. While in this latched state, even if Out1 transitions to high, node 952 will not change. Thus, the output signal Out3 will not change. But from this state, when Out2 transitions to low, the node 954 will transition to high and the node 958 will transition to high. In this state, the Out1 signal can pass through gate 938 because the latch condition is released. Thus, the output signal Out3 is no longer locked to low.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A circuit comprising:
a first buffer configured to receive an incoming signal and to generate a first output signal based on the incoming signal;
a second buffer configured to receive the incoming signal and to generate a second output signal based on the incoming signal, the second buffer exhibiting hysteresis with a lower threshold and an upper threshold; and
an output block configured to receive the first output signal and the second output signal and to generate a third output signal based on the first and second output signals, the output block being configured to switch a logic state of the third output signal in response to a transition of a logic state of the first output signal, and to lock the logic state of the third output signal until the output block receives a transition of a logic state of the second output signal, wherein the first buffer exhibits hysteresis with a lower threshold and an upper threshold, and the upper threshold of the second buffer is more positive than the upper threshold of the first buffer, and wherein the lower threshold of the second buffer is more negative than the lower threshold of the first buffer.

2. The circuit of claim 1, wherein, from an initial state in which the incoming signal is low, the first output signal is in a first logic state, the second output signal is in a second logic state, and the third output signal is in a third logic state:

when the incoming signal rises above the upper threshold of the first buffer, the first buffer transitions the first output signal to a fourth logic state, the output block transitions the third output signal to a sixth logic state based on the fourth logic state, and the output block locks the third output signal in the sixth logic state based on the fourth logic state; and when the incoming signal rises above the upper threshold of the second buffer, the second buffer transitions the second output signal to a fifth logic state, and the output block unlocks the third output signal based on the fifth logic state.

3. The circuit of claim 2, wherein:

when the incoming signal falls below the lower threshold of the first buffer, the first buffer transitions the first output signal to the first logic state, the output block transitions the third output signal to the third logic state based on the first logic state, and the output block locks the third output signal in the third logic state based on the first logic state; and when the incoming signal falls below the lower threshold of the second buffer, the second buffer transitions the second output signal to the second logic state, and the output block unlocks the third output signal based on the second logic state.

4. The circuit of claim 1, wherein the first buffer has substantially zero hysteresis and wherein the lower threshold and the upper threshold of the first buffer are both approximately at a first threshold.

5. The circuit of claim 4, wherein, from an initial state in which the incoming signal is low, the first output signal is in a first logic state, the second output signal is in a second logic state, and the third output signal is in a third logic state:

when the incoming signal rises above the first threshold, the first buffer transitions the first output signal to a fourth logic state, the output block transitions the third output signal to a sixth logic state based on the fourth logic state, and the output block locks the third output signal in the sixth logic state based on the fourth logic state; and when the incoming signal rises above the upper threshold of the second buffer, the second buffer transitions the second output signal to a fifth logic state, and the output block unlocks the third output signal based on the fifth logic state.

6. The circuit of claim 5, wherein:

when the incoming signal falls below the first threshold, the first buffer transitions the first output signal to the first logic state, the output block transitions the third output signal to the third logic state based on the first logic state, and the output block locks the third output signal in the third logic state based on the first logic state; and when the incoming signal falls below the lower threshold of the second buffer, the second buffer transitions the second output signal to the second logic state, and the output block unlocks the third output signal based on the second logic state.

7. The circuit of claim 1, wherein one or both of the first buffer and the second buffer is or includes a Schmitt trigger circuit.

8. The circuit of claim 1, wherein the output block is configured to lock and unlock the third output signal by latching and unlatching, respectively, the third output signal in response to transitions of the second buffer.

9. A circuit comprising:

a first buffer configured to receive an incoming signal and to generate a first output signal based on the incoming signal, the first buffer having one or more first thresholds;

a second buffer configured to receive the incoming signal and to generate a second output signal based on the incoming signal, the second buffer exhibiting hysteresis with a lower threshold and an upper threshold; and an output block configured to receive the first output signal and the second output signal and to generate a third output signal based on the first and second output signals, the output block being configured to switch a logic state of the third output signal in response to a transition of a logic state of the first output signal and to lock the logic state of the third output signal until the output block receives a transition of a logic state of the second output signal;

wherein, from an initial state in which the incoming signal is low, the first output signal is in a first logic state, the second output signal is in a second logic state, and the third output signal is in a third logic state:

when the incoming signal rises above the one or more first thresholds, the first buffer transitions the first output signal to a fourth logic state, the output block transitions the third output signal to a sixth logic state based on the fourth logic state, and the output block locks the third output signal in the sixth logic state based on the fourth logic state; and when the incoming signal rises above the upper threshold of the second buffer, the second buffer transitions the second output signal to a fifth logic state, and the output block unlocks the third output signal based on the fifth logic state.

wherein, from an initial state in which the incoming signal is high, the first output signal is in the fourth logic state, the second output signal is in the fifth logic state, and the third output signal is in the sixth logic state:

when the incoming signal falls below the one or more first thresholds, the first buffer transitions the first output signal to the first logic state, the output block transitions the third output signal to the third logic state based on the first logic state, and the output block locks the third output signal in the third logic state based on the first logic state; and when the incoming signal falls below the lower threshold of the second buffer, the second buffer transitions the second output signal to the second logic state, and the output block unlocks the third output signal based on the second logic state.

10. The circuit of claim 9, wherein the first buffer exhibits hysteresis with a lower threshold and an upper threshold, and wherein the one or more first thresholds consist of the lower threshold of the first buffer and the upper threshold of the first buffer.

11. The circuit of claim 10, wherein the upper threshold of the second buffer is more positive than the upper threshold of the first buffer, and wherein the lower threshold of the second buffer is more negative than the lower threshold of the first buffer.

12. The circuit of claim 9, wherein the first buffer has substantially zero hysteresis and wherein the one or more first thresholds consist of a single first threshold.

13. The circuit of claim 9, wherein one or both of the first buffer and the second buffer is or includes a Schmitt trigger circuit.

14. A memory device comprising:
a first buffer configured to receive an incoming signal and to generate a first output signal based on the incoming signal, the first buffer having one or more first thresholds;
a second buffer configured to receive the incoming signal and to generate a second output signal based on the incoming signal, the second buffer exhibiting hysteresis with a lower threshold and an upper threshold; and
an output block configured to receive the first output signal and the second output signal and to generate a third output signal based on the first and second output signals, the output block being configured to switch a logic state of the third output signal in response to a transition of a logic state of the first output signal and to lock the logic state of the third output signal until the output block receives a transition of a logic state of the second output signal;
wherein, from an initial state in which the incoming signal is low, the first output signal is in a first logic state, the second output signal is in a second logic state, and the third output signal is in a third logic state:
  when the incoming signal rises above the one or more first thresholds, the first buffer transitions the first output signal to a fourth logic state, the output block transitions the third output signal to a sixth logic state based on the fourth logic state, and the output block locks the third output signal in the sixth logic state based on the fourth logic state; and
  when the incoming signal rises above the upper threshold of the second buffer, the second buffer transitions the second output signal to a fifth logic state, and the output block unlocks the third output signal based on the fifth logic state.
wherein, from an initial state in which the incoming signal is high, the first output signal is in the fourth logic state, the second output signal is in the fifth logic state, and the third output signal is in the sixth logic state:
  when the incoming signal falls below the one or more first thresholds, the first buffer transitions the first output signal to the first logic state, the output block transitions the third output signal to the third logic state based on the first logic state, and the output block locks the third output signal in the third logic state based on the first logic state; and
  when the incoming signal falls below the lower threshold of the second buffer, the second buffer transitions the second output signal to the second logic state, and the output block unlocks the third output signal based on the second logic state.

15. The memory device of claim 14, wherein the first buffer has substantially zero hysteresis.

16. The memory device of claim 14, wherein one or both of the first buffer and the second buffer is or includes a Schmitt trigger circuit.

17. The memory device of claim 14, wherein the incoming signal is a data signal.

18. The memory device of claim 14, wherein the incoming signal is a clock signal.

* * * * *